United States Patent [19]
Chen et al.

[11] Patent Number: 5,182,627
[45] Date of Patent: Jan. 26, 1993

[54] INTERCONNECT AND RESISTOR FOR INTEGRATED CIRCUITS

[75] Inventors: Fusen E. Chen; Girish A. Dixit, both of Dallas; Robert O. Miller, The Colony, all of Tex.

[73] Assignee: SGS-Thomson Microelectronics, Inc., Carrollton, Tex.

[21] Appl. No.: 769,171

[22] Filed: Sep. 30, 1991

[51] Int. Cl.$^5$ .................. H01L 29/04; H01L 27/02; H01L 29/34; H01L 23/48
[52] U.S. Cl. ...................... 257/49; 257/538; 257/755
[58] Field of Search ............ 357/59, 51, 54, 67, 357/71

[56] References Cited

U.S. PATENT DOCUMENTS

| | | | |
|---|---|---|---|
| 4,948,747 | 8/1990 | Pfiester | 437/60 |
| 4,961,103 | 10/1990 | Saitoh et al. | 357/51 |
| 4,968,645 | 11/1990 | Baldi et al. | 437/200 |
| 5,068,201 | 11/1991 | Spinner, III et al. | 437/60 |

Primary Examiner—Mark V. Prenty
Attorney, Agent, or Firm—Lisa K. Jorgenson; Richard K. Robinson

[57] ABSTRACT

A method is provided for forming a polycrystalline silicon resistive load element of a semiconductor integrated circuit, and an integrated circuit formed according to the same. A lightly doped first conductive layer having a conductivity of a first type. A first oxide layer is formed over the integrated circuit with a first opening therethrough exposing a portion of the first conductive layer. Using the first oxide layer as a mask, the exposed portion of the first conductive layer is then implanted with a dopant of a second conductivity type to form a junction between the exposed portion and the portion covered by the mask. A second oxide region is then formed on a portion of the first oxide layer in the first opening, over the junction and over a portion of the exposed first conductive layer adjacent to the junction. A silicide is formed over the exposed portion of the first conductive layer.

9 Claims, 4 Drawing Sheets

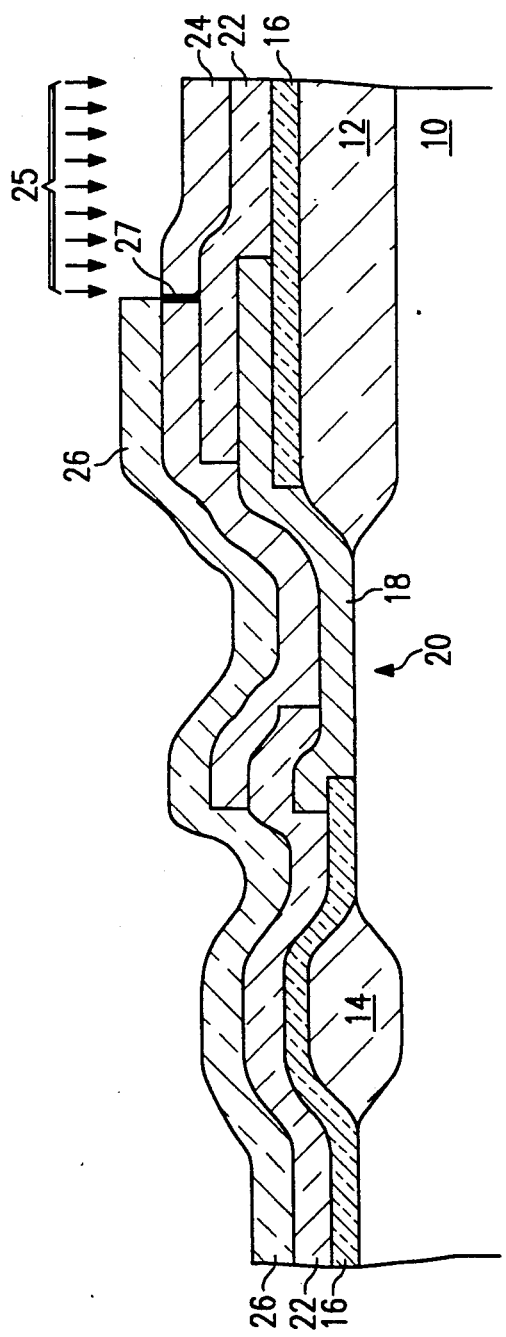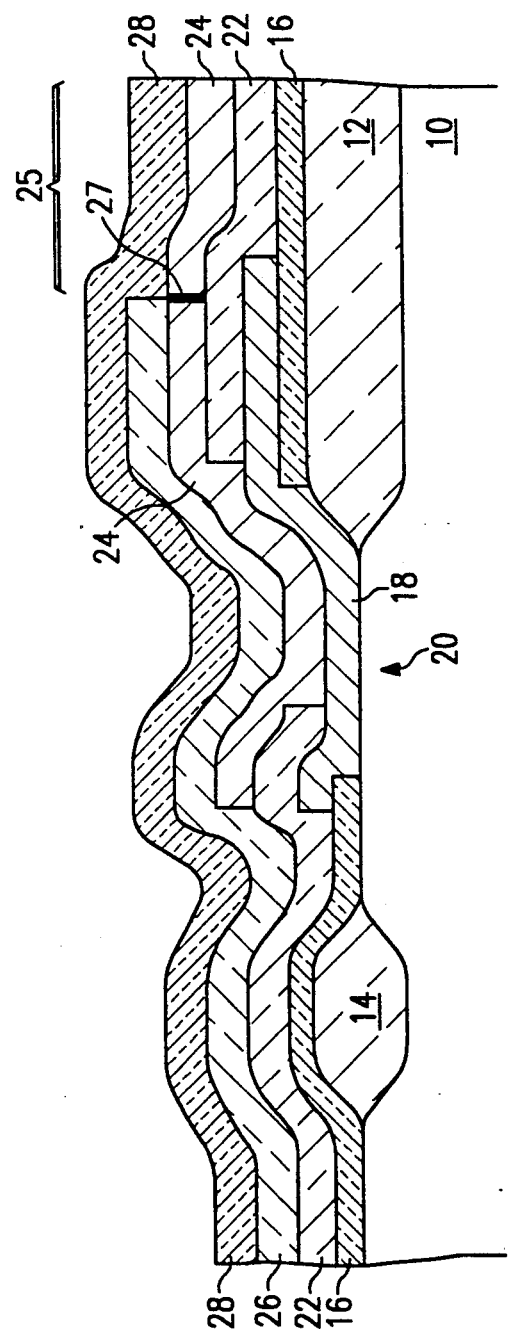

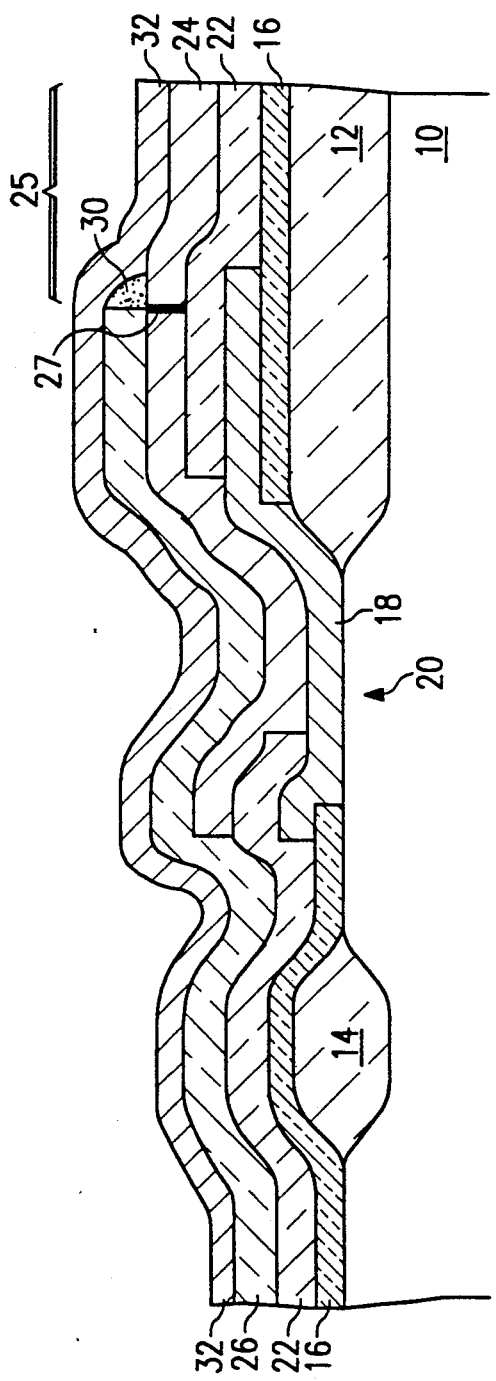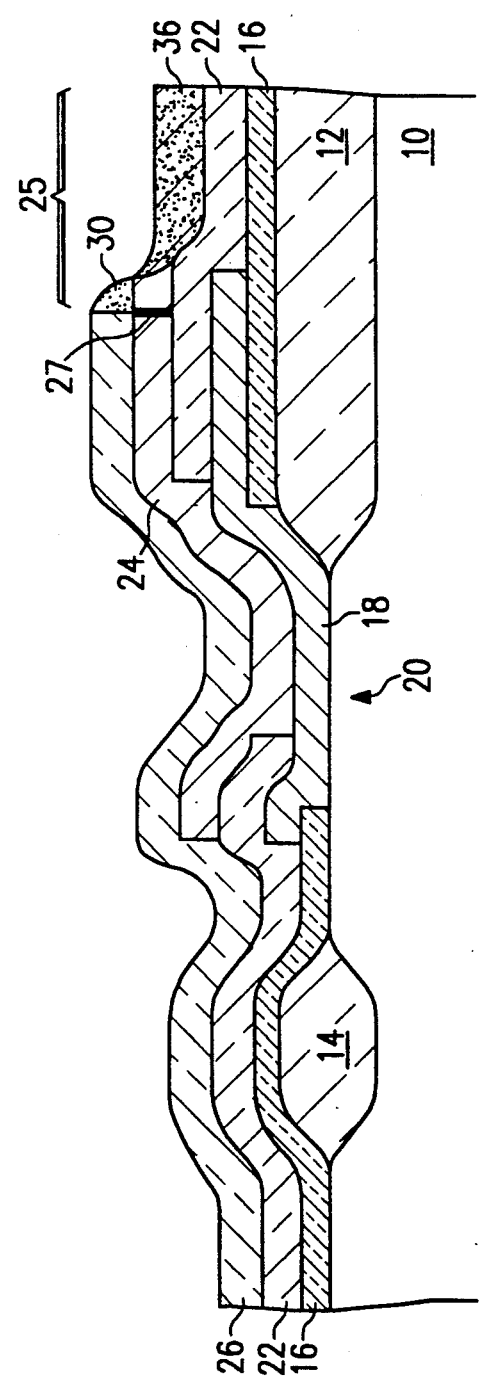

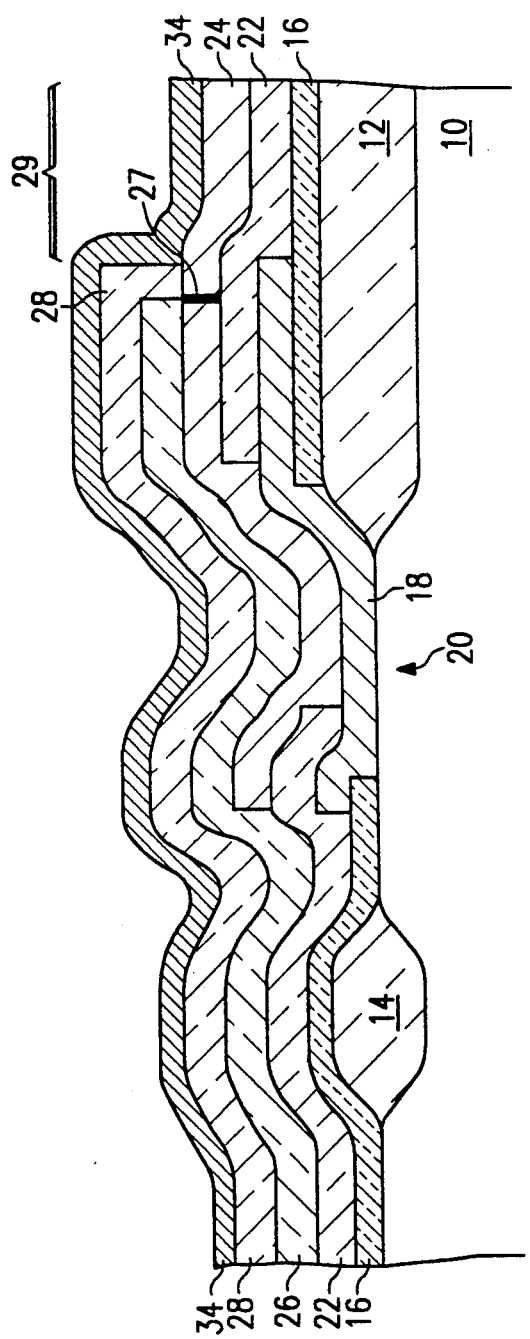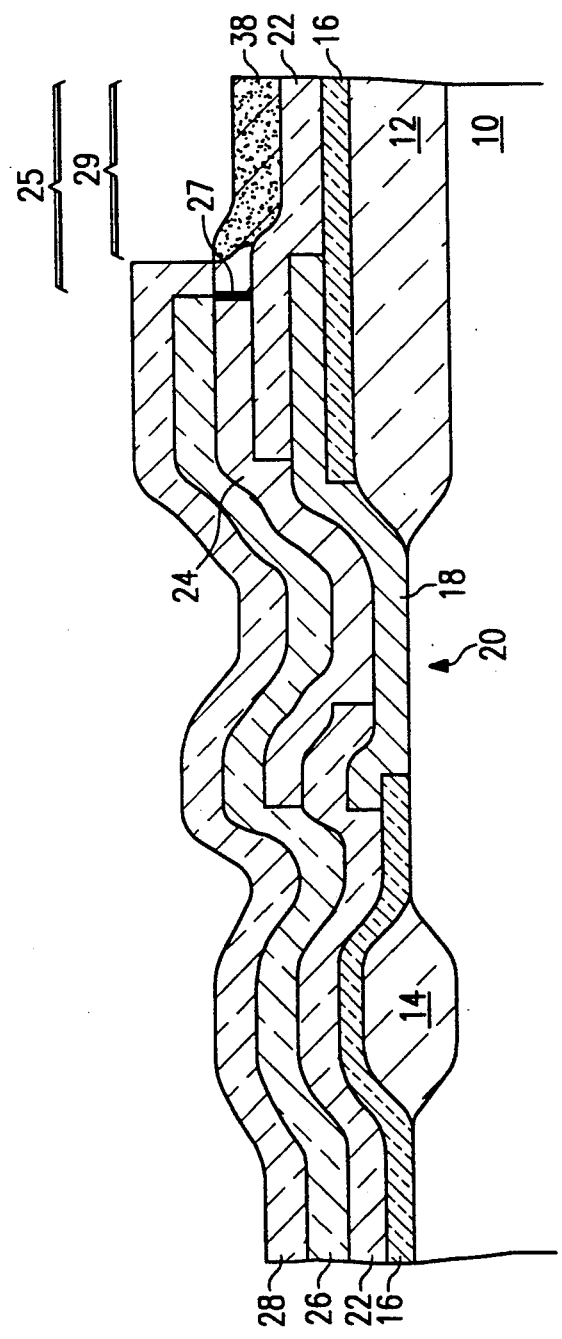

INTERCONNECT AND RESISTOR FOR INTEGRATED CIRCUITS

1. FIELD OF THE INVENTION

The present invention relates generally to semiconductor integrated circuits, and more specifically to a structure and method of forming a low resistance region and a high resistance region in the same polysilicon layer.

2. BACKGROUND OF THE INVENTION

The basic CMOS SRAM cell can be formed using cross-coupled CMOS inverters having 2-each N-channel and P-channel transistors. The cell is accessed by, typically, 2 N-channel control gates for a standard SRAM cell and 4 control gates for 2-port memory devices. Use of the P-channel transistors as the load devices for the SRAM cell results in the cell having favorable electrical characteristics.

The CMOS SRAMs may also use a four transistor cell design having resistive load devices in place of the P-channel transistors. This design is used in order to conserve physical layout area over the traditional six transistor cell design. This design also decreases chip costs. Two N-channel transistors are used to form a cross-coupled latch, while two additional N-channel transistors are used to provide access to the cell for reading and writing data. Two load devices are connected between the N-channel transistors in the latch and the power supply.

In the prior art, the resistive load devices are formed after formation of the N-channel transistors. After the transistors have been formed, a dielectric layer is deposited and contact openings are formed to the substrate. A second polycrystalline silicon layer is deposited and lightly doped N-type to achieve a resistivity in the range of $10^6$ to $10^{13}$ ohms/square. This blanket implant determines the load resistor value.

The second polycrystalline silicon layer also serves to provide interconnect between various portions of the integrated circuit. The second layer can be used for the $V_{cc}$ supply connected to the load resistors. This layer may also be used for local interconnect between various portions of the device. Thus, the interconnect portions of the second polycrystalline silicon layer must have a relatively low resistivity.

It is desirable to use a single polycrystalline silicon layer for both the resistive load devices and the interconnect or the $V_{cc}$ power supply. This approach is more economical than forming such regions from separate polycrystalline silicon layers, and also results in a relatively smoother chip surface. However, such an approach has an important drawback in that the resistivity of the resistive element region and the interconnect regions or the $V_{cc}$ power supply region are somewhat related. Historically, it has been difficult to form both very high resistance and very low resistance regions in a single polycrystalline silicon layer.

It would be desirable to provide a structure and method for fabricating high resistance and low resistance regions in a single polycrystalline silicon layer. It would be further desirable that a technique to form such regions is compatible with current technology and which adds a minimal amount of complexity to device process flows.

SUMMARY OF THE INVENTION

The invention may be incorporated into a method for forming an integrated circuit, and the integrated circuit formed thereby, by forming a first conductive layer wherein the first conductive layer has a first region of a first conductivity type and a second region of a second conductivity type. A junction is formed between the first and second regions. A second oxide layer is then formed over the second region, the junction and an adjacent portion of the first region of the first conductive layer. A silicide region is formed over the second region of the first conductive layer not covered by the second oxide layer.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1-6 are cross-sectional views of the fabrication of a semiconductor device structure according to the present invention.

FIGS. 7-8 are cross-sectional views of the fabrication of a semiconductor device structure according to an alternative of the present invention.

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
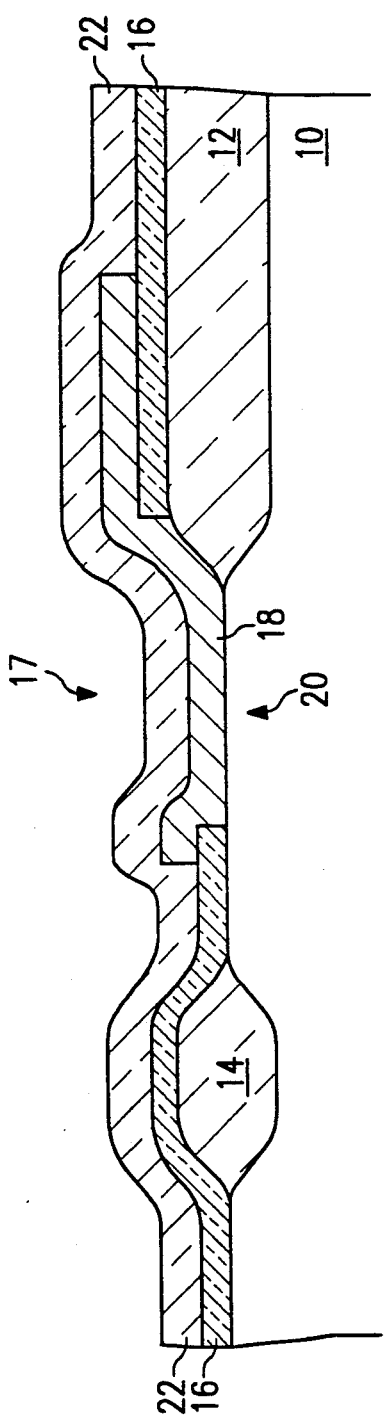

Referring to FIG. 1, an integrated circuit is formed in a silicon substrate 10. Field oxide regions 12, 14 separate selected active areas of the circuit such as the area shown as region 20. Polycrystalline silicon gates (not shown) are generally formed over the active regions to define field effect transistors. Active area 20 in substrate 10 may be a source/drain region of a field effect transistor.

A first oxide layer 16 is formed over the integrated circuit, patterned and etched to form a first opening 17 through the oxide layer exposing a portion of the substrate 10. A first conductive layer 18, generally a doped polysilicon or a polycide, may be formed over the integrated circuit, patterned and etched to form the lower layer of a shared contact region. A second oxide layer 22 may then be formed over the integrated circuit. Layer 22 may typically have a thickness of between approximately 900–2000 angstroms.

Figure 2:
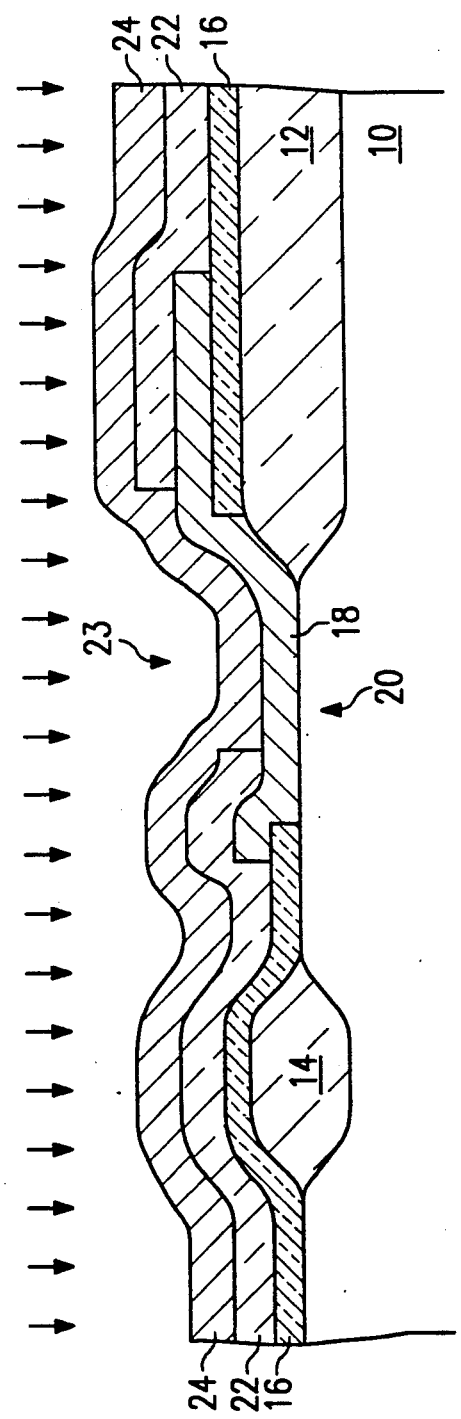

Referring to FIG. 2, layer 22 is then patterned and etched to form an opening 23 in layer 22 exposing a portion of the first conductive layer 18. A second conductive layer 24 is then formed over the second oxide layer 22 and in the opening 23 over the first conductive layer 18 to form the shared contact. Layer 24 will typically have a thickness of between approximately 500-2000 angstroms. Layer 24 is then lightly doped as shown by the arrows, preferably with a P-type dopant such as boron, to increase the conductivity of the layer or to decrease the layer's resistivity. Device fabrication up to this stage utilizes conventional process steps well known in the art.

Referring to FIG. 3, a third oxide layer 26 is formed over the integrated circuit, patterned and etched to expose a region 25 of the second conductive layer 24 not in contact with the underlying first conductive layer 18. Oxide layer 26 typically has a thickness of between approximately 900-2000 angstroms.

Region 25 is then implanted with a dopant of opposite conductivity from the dopant implanted across the entire layer 24. If the blanket implant is P-type, a N-type dopant such as arsenic is implanted into region 25 as shown by the arrows. Oxide layer 26 acts as a mask over the portion of layer 24 underlying layer 26. Once region 25 is implanted with a dopant of the opposite conductivity, a P-N junction 27 is formed between region 25 and the portion of layer 24 underlying oxide layer 26. The P-N junction is formed where the two regions of polycrystalline silicon having different conductivity types make contact. The P-N junction 27 is reverse biased since the N-type region is connected to the power supply. Since the P-N junction is formed in polysilicon, it is leaky, so that some reverse current flows. The P-N junction acts as the resistive load device such as in a CMOS SRAM cell between a N-channel transistor and its power supply. The N-channel transistor is formed elsewhere on the surface of the integrated circuit.

Referring to FIG. 4, a fourth oxide layer 28 is then formed over the integrated circuit. Layer 28 will have a thickness of between approximately 1000-5000 angstroms.

Referring to FIG. 5, an etchback step is performed to form a sidewall oxide spacer 30 o the side of oxide layer 26 and in the opening of region 25. A metal layer 32 is then deposited to a depth of between approximately 200-1000 angstroms. Metal layer 32 may be any refractory metal, such as titanium, which can be reacted with silicon to form a silicide and increase the layer's conductivity. For purposes of illustration, layer 32 will be referred to as titanium.

Referring to FIG. 6, titanium layer 32 is annealed to thermally react with the underlying second conductive layer 24 in region 25 not covered by the oxide sidewall spacer 30. A titanium disilicide layer 36 is formed during the annealing process. Any unreacted titanium remaining after the annealing step is then stripped away. The purpose of forming the silicide layer is to reduce the resistivity of the conductive layer to form the $V_{cc}$ power supply in the same polysilicon layer 24 as the resistive load device 27. The oxide sidewall spacer 30 protects the P-N junction 27 from being silicided during the annealing process. If junction 27 had been silicided, a short circuit condition would have been created across the junction making the resistive load a conductor instead of a high resistance element.

Referring to FIG. 7, an alternative method of forming an oxide region to protect the P-N junction 27 during the siliciding process is shown. The fifth oxide layer 28 is formed over the integrated circuit as described in connection with FIG. 4. Oxide layer 28 is then patterned and etched to form an opening 29 which is smaller than region 25. A metal layer 34, capable of forming a silicide, is formed as above. Again, for purposes of illustration, this layer will be referred to as titanium. The titanium is annealed as described above to react with the underlying second conductive layer 24 in opening 29.

Referring to FIG. 8, any unreacted titanium will be stripped away after forming a titanium disilicide layer 38. As with the sidewall oxide spacer 30, the portion of oxide layer 28 remaining after the etch step in region 25 will protect the P-N junction 27 from being silicided and will prevent a short across the junction.

An advantage of this invention over prior art is that an area of low resistance and an area of high resistance is made in the same polycrystalline silicon layer. The layer can then be used for both the resistive load device and the $V_{cc}$ power supply or local interconnect. The layer is lightly doped with a dopant of first conductivity type. One region of the layer to become the area for the $V_{cc}$ power supply is implanted with a dopant of a second and opposite conductivity type. The conductivity types may also be the same conductivity type but of significantly different doping levels. A P-N junction is formed between the two regions in the silicon layer having different conductivities. An oxide layer protects the junction during silicidation of the $V_{cc}$ power supply area within the silicon layer. No substantial silicidation of the junction occurs and any short of the junction is prevented.

While the invention has bee particularly shown and described with reference to a preferred embodiment, it will be understood by those skilled in the art that various changes in form and detail may be made therein without departing from the spirit and scope of the invention.

What is claimed is:

1. A structure consisting of a portion of a semiconductor integrated circuit, comprising:
    a first oxide region disposed over the first region, the conductivity type and a second region of a second conductivity type and having a junction between the first and second regions;
    first oxide region disposed over the first region, the junction and a portion of the second region adjacent to the junction; and
    a silicide region disposed over the portion of the second region not covered by the first oxide region.

2. The structure of claim 1, wherein the first conductivity type is P-type.

3. The structure of claim 3, wherein the second conductivity type is N-type.

4. The structure of claim 1, wherein the first conductive layer has a thickness of between approximately 500-2000 angstroms.

5. The structure of claim 1, wherein the first oxide region has a thickness of between approximately 900-2000 angstroms.

6. The structure of claim 1, wherein a second oxide region is disposed under the first conductive layer and wherein the second oxide region has an opening therethrough exposing a portion of a second conductive layer disposed thereunder.

7. The structure of claim 6, wherein the first conductive layer is further disposed over the exposed portion of the second conductive layer in the opening.

8. The structure of claim 1, wherein the silicide region comprises a refractory metal silicide.

9. The structure of claim 8, wherein the refractory metal silicide comprises a titanium disilicide.

* * * * *

UNITED STATES PATENT AND TRADEMARK OFFICE
CERTIFICATE OF CORRECTION

PATENT NO. : 5,182,627
DATED : January 26, 1993
INVENTOR(S) : Fusen E. Chen; Girish A. Dixit; Robert O. Miller It is certified that error appears in the above-identified patent and that said Letters Patent is hereby corrected as shown below:

In Column 3, line 37, change "o" to --on--.

In Column 4, line 27, change "bee" to --been--.

Column 4,
In Claim 1, line 36, change "a first oxide region disposed over the first region, the" to --a first conductive layer having a first region of a first--.

Col. 4, claim 1, line 40, the word "a" should be added at the beginning of the sentence.

Signed and Sealed this

Twenty-fourth Day of May, 1994

Attest:

BRUCE LEHMAN

Attesting Officer

Commissioner of Patents and Trademarks